(12) United States Patent
Cho et al.

(10) Patent No.: US 7,816,855 B2
(45) Date of Patent: Oct. 19, 2010

(54) LED DEVICE HAVING DIFFUSE REFLECTIVE SURFACE

(75) Inventors: Jae-hee Cho, Yongin-si (KR); Jong-kyu Kim, Troy, NY (US); Cheol-soo Sone, Anyang-si (KR); E. Fred Schubert, Troy, NY (US)

(73) Assignees: Samsung LED Co., Ltd. (KR); Rensselaer Polytechnic Institute, Troy, NY (US)

( * ) Notice: Subject to any disclaimer, the term of this patent is extended or adjusted under 35 U.S.C. 154(b) by 867 days.

(21) Appl. No.: 11/318,557

(22) Filed: Dec. 28, 2005

(65) Prior Publication Data

US 2006/0170335 A1    Aug. 3, 2006

Related U.S. Application Data

(60) Provisional application No. 60/648,494, filed on Jan. 31, 2005.

(30) Foreign Application Priority Data

May 13, 2005    (KR) .................. 10-2005-0040164

(51) Int. Cl.
    *H05B 33/00*    (2006.01)
(52) U.S. Cl. .................. 313/501; 313/502; 313/512
(58) Field of Classification Search .......... 313/498–512
    See application file for complete search history.

(56) References Cited

U.S. PATENT DOCUMENTS

| 6,069,440 | A | 5/2000 | Shimizu et al. |
| 6,635,363 | B1 * | 10/2003 | Duclos et al. ............ 428/690 |
| 6,670,648 | B2 * | 12/2003 | Isokawa et al. ............ 257/99 |
| 6,791,259 | B1 | 9/2004 | Stokes et al. |
| 2003/0183852 | A1 | 10/2003 | Takenaka |
| 2003/0230751 | A1 | 12/2003 | Harada |
| 2004/0100192 | A1 * | 5/2004 | Yano et al. ............ 313/512 |
| 2004/0183085 | A1 | 9/2004 | Okazaki |

FOREIGN PATENT DOCUMENTS

| EP | 1418628 | 5/2004 |
| JP | 2004-031657 A | 1/2004 |
| WO | 2004/021461 A2 | 3/2004 |

(Continued)

OTHER PUBLICATIONS

European Search Report issued Feb. 5, 2009.

(Continued)

*Primary Examiner*—Nimeshkumar D Patel
*Assistant Examiner*—Anne M Hines
(74) *Attorney, Agent, or Firm*—Cantor Colburn LLP

(57) ABSTRACT

A LED device is provided having a diffuse reflective surface which includes an LED chip emitting light, a reflector cup having the LED chip arranged at a bottom surface thereof and having an angled surface which diffusely reflects the light emitted by the LED chip, and a light conversion material provided in the reflector cup for converting the light emitted by the LED chip into visible light rays. The light-conversion material is spatially separated from the LED chip by a length equal or greater than the maximum length of the LED chip.

8 Claims, 8 Drawing Sheets

FOREIGN PATENT DOCUMENTS

WO    2004/097294 A1    11/2004

OTHER PUBLICATIONS

Optical-Grade Spectralon Material, "Diffuse reflectance material specially fabricated for optical components",XP002511027, www.labshere.com,, pp. 1 and 2.

Art Springsteen, Standards for the measurement of diffuse reflectance—an overview of available materials and measurement laboratories, Analytica Chimica Acta 380 (1999) 379-390.

Office Action issued by the Japanese Patent Office on Feb. 16, 2010.

Art Springsteen, Standards for the measurement of diffuse reflectance an overview of available materials and measurement laboratories, Analytica Chimica Acta, U.S. Elsevier Science, vol. 380, Issues 2-3, pp. 379-390 (Particularly, refer to the last paragraphy of p. 381.).

* cited by examiner

FIG. 6

| PARAMETERS | | | LIGHT EXTRACTION EFFICIENCY (%) | | | |
|---|---|---|---|---|---|---|
| | | | PHOSPHOR INSIDE | | PHOSPHOR ON TOP | |
| b(μm) | h(mm) | θ(°) | MIRROR SURFACE | DIFFUSE SURFACE | MIRROR SURFACE | DIFFUSE SURFACE |
| 150 | 0.3 | 45 | | | 58.8 | 72.3 |
| | 0.5 | | | | 60.9 | 76.2 |
| | 0.8 | | | | 61.5 | 78.9 |
| | 1.0 | | 45.3 | 66.6 | 61.7 | 79.6 |
| | 1.2 | | | | | 80.3 |
| | 1.5 | | | | 61.9 | 80.8 |
| | 2.0 | | | | | 81.1 |
| | 2.5 | | | | 62.0 | 81.3 |
| 50 | 1.0 | 30 | | | 58.5 | 72.6 |
| | | 45 | 46.4 | 66.2 | 61.2 | 79.6 |
| | | 60 | | | 67.7 | 83.4 |

| Case | UV LED + BLUE PHOSPHOR | BLUE LED + YELLOW PHOSPHOR |
|---|---|---|
| MIRROR SURFACE PHOSPHOR INSIDE | 67.9 | 59.9 |
| MIRROR SURFACE PHOSPHOR ON TOP | 76.8 | 64.6 |
| DIFFUSE SURFACE PHOSPHOR ON TOP | 86.2 | 69.4 |

UNIT : %

LED DEVICE HAVING DIFFUSE REFLECTIVE SURFACE

CROSS-REFERENCE TO RELATED PATENT APPLICATIONS

This application claims priority of U.S. Provisional Patent Application No. 60/648,494 filed on Jan. 31, 2005, and claims the benefit of Korean Patent Application No. 10-2005-0040164, filed on May 13, 2005, the disclosure of which are incorporated herein in their entirety by reference.

This invention was supported, in whole or in part, with funding under a National Science Foundation grant, grant number ECS 0401075. The United States government has certain rights in this invention.

BACKGROUND OF THE DISCLOSURE

1. Field of the Disclosure

The present disclosure relates to a light emitting diode (LED) device, and more particularly, to an LED device which employs a large spatial separation between a luminescence-generating semiconductor and a phosphorescence-generating light-conversion material and has a reflector cup having a diffuse reflective surface to diffusely reflect light, thus improving a luminous efficiency.

2. Description of the Related Art

Light emitting diode (LED) devices convert ultraviolet light rays or blue light rays emitted from an LED chip into visible light rays that have a longer wavelength. Recently, the LED device is drawing wide attention for its function of emitting white light or visible light rays of various colors. For example, in a white LED device, an ultraviolet ray emitted from the LED chip excites a phosphor. Then, the three primary colors of light, that is, red (R), green (G), and blue (B) visible rays, or yellow (Y) or blue (B) visible rays are emitted from the phosphor. The visible color rays emitted from the phosphor vary dependent on the composition of the phosphor. These visible rays combined with each other result in white light to the eyes of a human.

FIG. 1 is a sectional view of a conventional lamp type LED device that is disclosed in U.S. Pat. No. 6,069,440. Referring to FIG. 1, a lamp type LED device 10 includes a mount lead 11 and an inner lead 12. An LED chip 14 is installed in a reflector cup 20 that is formed in the upper portion of the mount lead 11. The LED chip 14 has an n electrode and a p electrode which are electrically connected to the mount lead 11 and the inner lead 12, respectively, by a wire 15. The LED chip 14 is covered by a phosphor layer 16 that is a mixture of phosphor and transparent encapsulant. These constituent elements are surrounded by a seal substance 17. The reflector cup 20 is coated with silver (Ag) or aluminum (Al) for the high reflection of visible light rays.

FIGS. 2A, 2B, and 2C show various arrangements of the phosphor in the reflector cup 20. Referring to FIGS. 2A, 2B, and 2C, the LED chip 14 is arranged at the bottom of the reflector cup 20. Phosphors 22 are distributed in the transparent encapsulant 16 in the reflector cup 20.

FIG. 2A shows the distribution of the phosphors 22 that are resolved in the transparent encapsulant (coating resin or polymer) 16 in the reflector cup 20. The LED chip 14 emits luminescence that excites the phosphors 22 to emit phosphorescence. Part of the phosphorescence collides against the surface of the LED chip 14 where it is reabsorbed. Thus, the luminous efficiency is lowered.

FIG. 2B shows that the phosphors 22 are distributed on the surface of the LED chip 14. in this case, a probability that the phosphorescence of the phosphors 22 collides against the LED chip 14 increases so that the luminous efficiency is reduced.

FIG. 2C shows that the phosphors 22 are separated from the LED chip 14. In this instance, the probability that the phosphorescence directly collides against the LED chip 14 is relatively lowered.

SUMMARY OF THE DISCLOSURE

To solve the above and/or other problems, the present invention may provide an LED device having a diffuse reflective surface which improves the luminous efficiency by lowering the probability that phosphorescence collides against the LED chip.

According to an aspect of the present invention, an LED device having a diffuse reflective surface comprises an LED chip emitting light, a reflector cup having the LED chip arranged at a bottom surface thereof and having an angled surface which diffusely reflects the light, and a light conversion material provided in the reflector cup for converting the light emitted by the LED chip into visible light rays.

The angled surface is processed so as to be rough. The amount of light reflected at the angled surface decreases as a reflection angle with respect to the perpendicular plane of the angled surface increases regardless of an incident angle of the light to the angled surface. The light conversion material is a phosphor that is excited by the light emitted from the LED chip to emit visible light rays.

The phosphor forms a phosphor layer in an upper portion of the reflector cup to be separated from the LED chip. The phosphor is spatially separated from the LED chip by a length equal or greater than the maximum length of the LED chip. The phosphor can be a single phosphor material or a plurality of phosphor materials that form a plurality of visible color rays, and the phosphors are mixed with one another.

The phosphor is a plurality of phosphors that form a plurality of visible color rays, and the phosphors are stacked in multiple layers. A convex portion is formed on an upper surface of the encapsulant material. The convex portion can have a hemispheric shape. The LED chip is formed of III-V group nitride-based semiconductor compounds.

BRIEF DESCRIPTION OF THE DRAWINGS

The above and other features and advantages of the present invention are described in detailed exemplary preferred embodiments thereof with reference to the attached drawings in which:

FIG. 6 is a table showing the result of a ray tracing simulation;

DETAILED DESCRIPTION OF EXEMPLARY EMBODIMENTS

Figure 1:
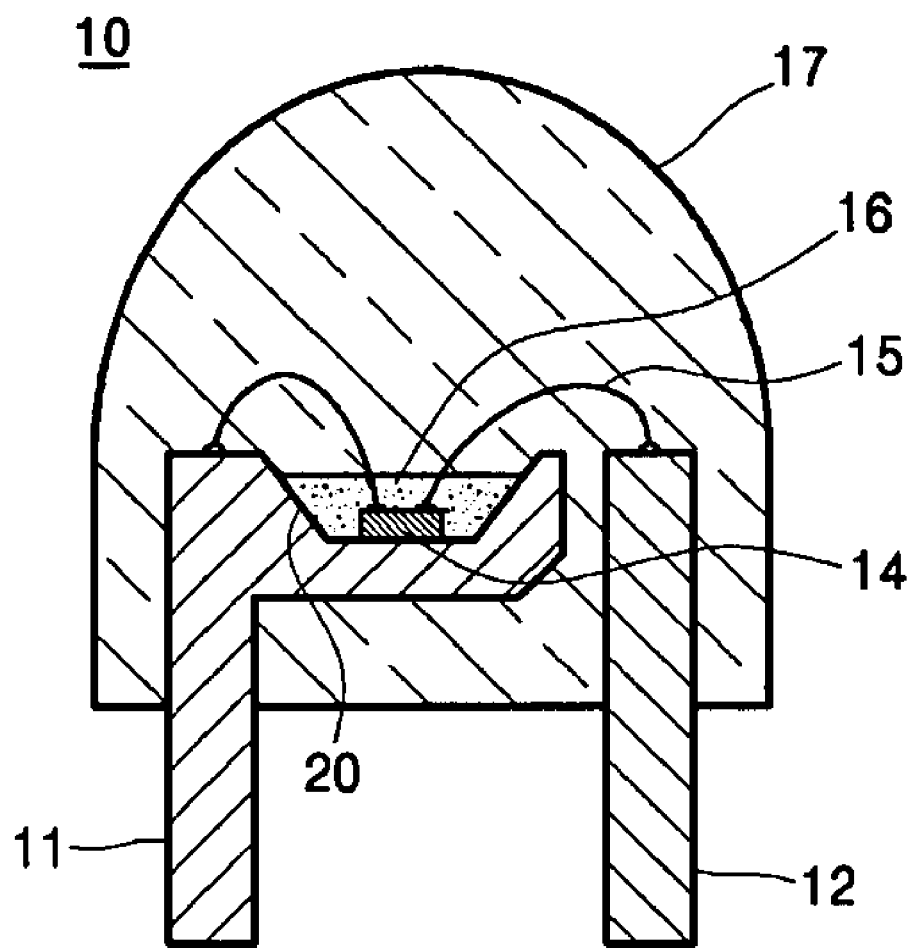
FIG. 1 is a sectional view of the conventional lamp type LED device.
Figure 2A:
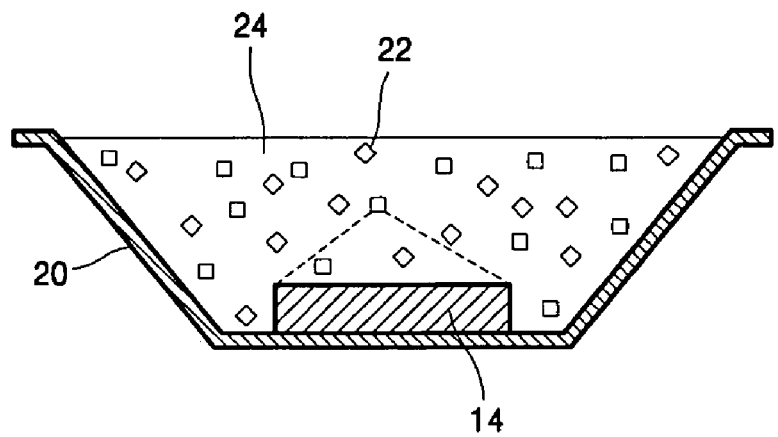
FIGS. 2A, 2B, and 2C are sectional views showing arrangements of phosphor in the reflector cup, especially FIG. 2C which further illustrates the principle of the present invention.
Figure 2B:
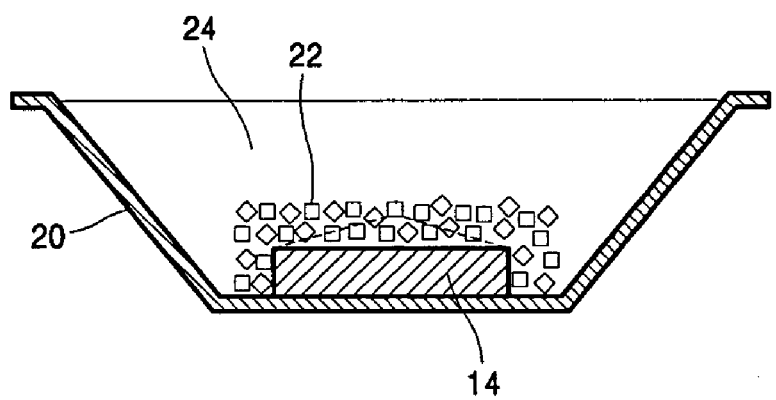
Figure 2C:
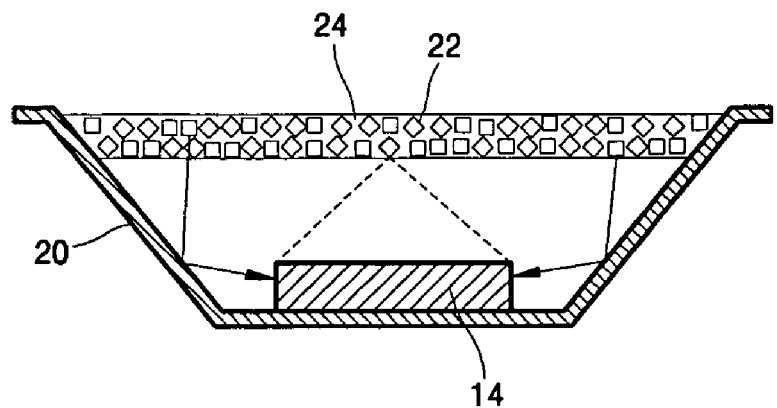
Figure 3:
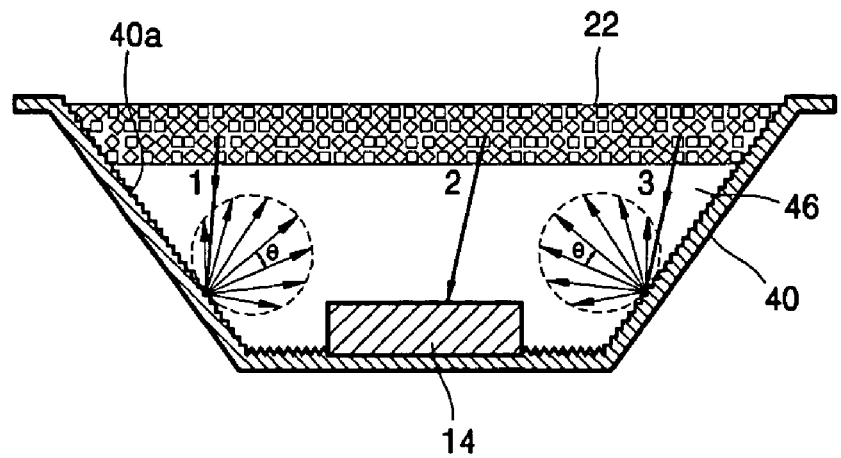
FIG. 3 is a view which additionally illustrates the principle of the present invention.

Referring to FIG. 3, the LED chip 14 that is a light emitter is installed on the bottom surface of a reflector cup 40. The reflector cup 40 is filled with a light transmitting material 46. A light conversion material for receiving light and outputting visible light rays having a longer wavelength is formed in the upper portion of the reflector cup 40. The light conversion material may be a plurality of phosphors 22 emitting a plurality of visible color rays or quantum dots. The inner surface of the reflector cup 40 including an angled surface is a diffuse surface 40a that is processed to be rough so as to emit diffusely. The diffuse surface 40a may be a rough surface obtained by, for example, sand blasting a metal surface. The phosphors 22 form a phosphor layer which is separated a predetermined distance from the LED chip 14. Because the phosphor layer is spatially separated from the LED chip 14, the probability that the phosphorescence directly collides against the surface of the LED chip 14 is lowered.

The phosphor layer can be formed by mixing the plurality of phosphors 22 that form a plurality of visible color rays. Alternatively, the phosphor layer may be a plurality of layers composed of a plurality of phosphors that form a plurality of visible color rays. The light transmitting material 46 can be made of a transparent material such as epoxy resin, silicon, or PMMA, capable of transmitting the light from the LED chip 14.

The LED chip 14 is formed of III-V group nitride-based semiconductor compounds. A ray 2 of the phosphorescence that the phosphors 22 having received the light from the LED chip 14 emit collides against the surface of the LED chip 14 so that 50% of the ray 2 is absorbed by the LED chip 14. Rays 1 and 3 are incident upon the angled surface of the reflector cup 40 at an angle and reflected as a diffuse light. At this time, only the part of the diffuse light collides against the LED chip 14 and most of the diffuse light is emitted to the outside. Thus, the probability that the phosphorescence is reflected and collides against the LED chip 14 is lowered.

The intensity of the diffuse light is proportional to a cosine function as shown in the following formula according to the angle of a diffuse surface with respect to a vertical plane of a diffuse surface regardless of the incident angle to the diffuse surface.

$$I_r \propto \cos \theta \qquad \text{[Formula 1]}$$

Here, $I_r$ denotes the intensity of a reflected light and $\theta$ denotes the angle of the reflection from the perpendicular direction of the diffuse surface. The diffuse surface can be obtained by sand blasting the reflection surface of the reflector cup 40 or by spraying nano-sized Ag or Al.

Figure 4:
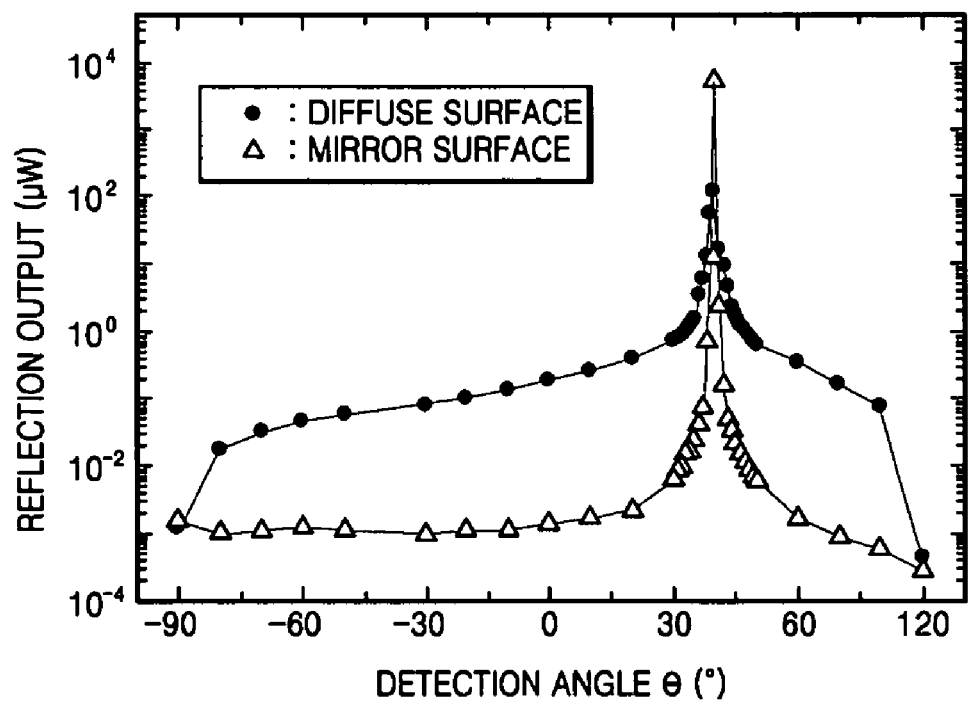
FIG. 4 is a graph showing the relationship of light reflection on a specular mirror surface and a diffuse surface of the reflector cup.

FIG. 4 is a graph showing the relationship of light reflection on a specular mirror surface and a diffuse surface of the reflector cup. Referring to FIG. 4, when the incident angle of light at a silver (Ag) coated reflective surface is 40°, the specular mirror surface shows the intensity of the light at the reflective angle of 40° to be as high as a level of about $10^4$. However, for the sand-blastered diffuse surface, the light intensity at the reflective angle of 40° is produced at a level of about $10^2$. At a different angle, the light intensity at the diffuse surface is greater by 2 orders than that at the reflection surface. Thus, the sand-blastered reflective surface exhibits the characteristics of both a diffuse surface and a specular mirror surface.

Figure 5A:
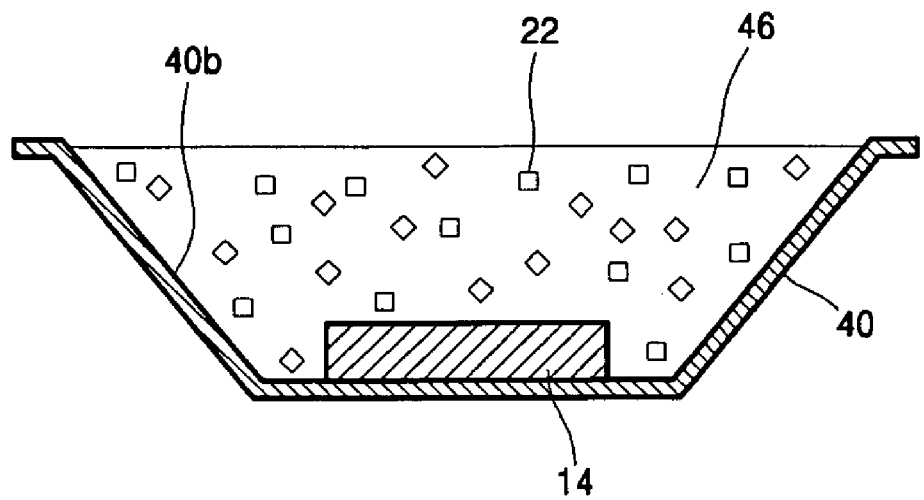
FIGS. 5A, 5B, 5C, and 5D show four examples in a ray tracing test for an LED device having a reflector chip with a diffuse surface according to an embodiment of the present invention and the conventional LED device having a reflector cup with a specular mirror surface.
Figure 5B:
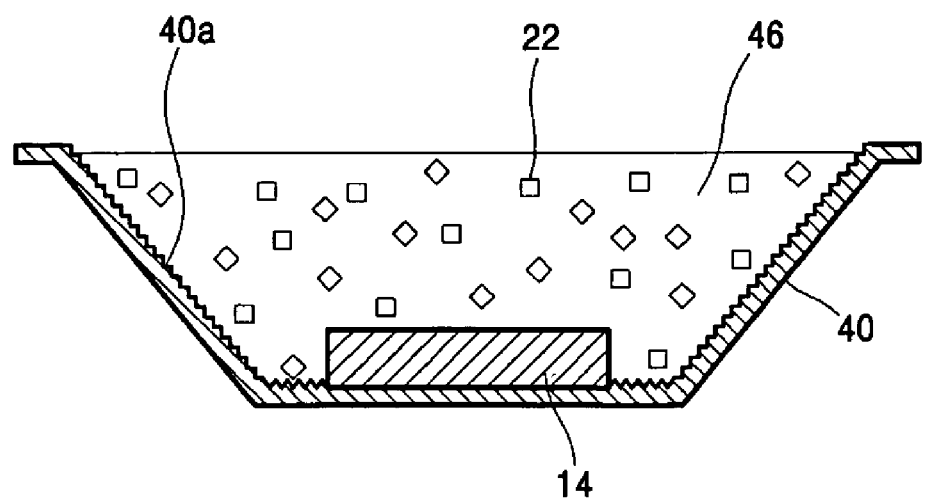
Figure 5C:
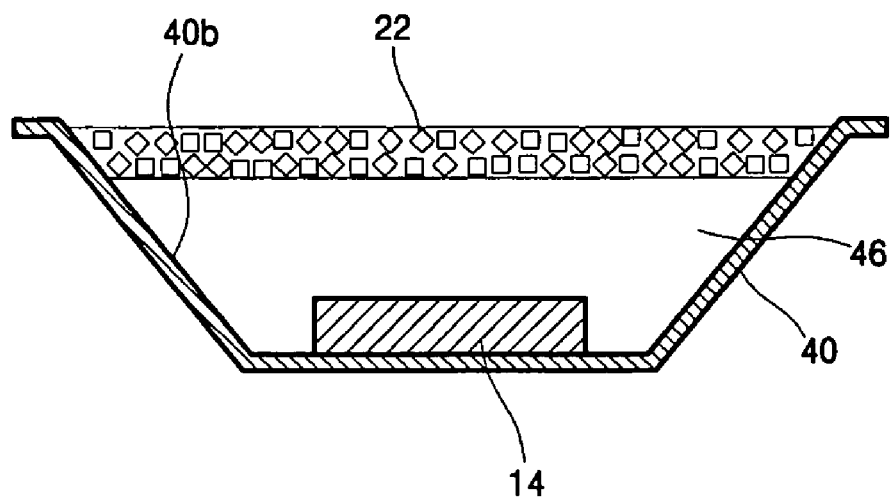
Figure 5D:
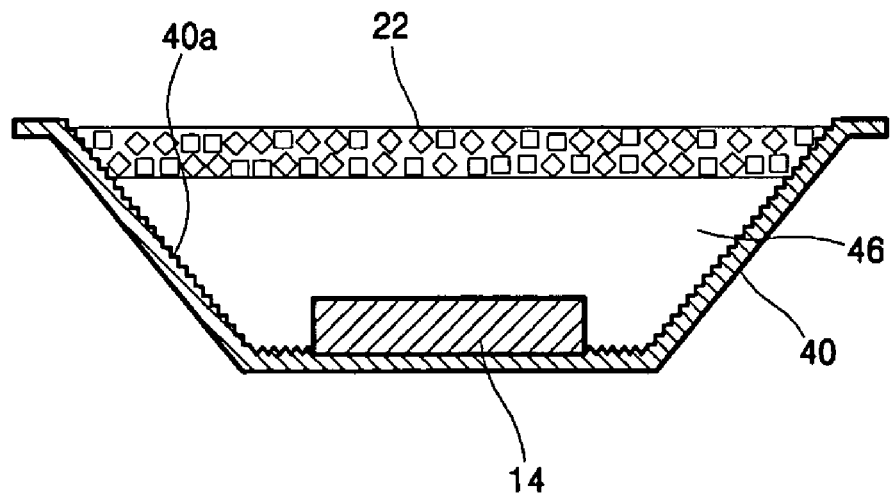

FIGS. 5A, 5B, 5C, and 5D show four examples in a ray tracing test for an LED device having a reflector cup with a diffuse surface according to an embodiment of the present invention and the conventional LED device having a reflector cup with a specular mirror surface. FIGS. 5A and 5B show examples in which the phosphors 22 are distributed inside the reflector cup 40 while FIGS. 5C and 5D show examples in which the phosphors 22 form a layer at the top portion of the reflector cup 40. FIGS. 5A and 5C show the reflector cup 40 having a specular mirror surface 40b while FIGS. 5B and 5D show the reflector cup 40 having a diffuse surface 40a.

Figure 7:
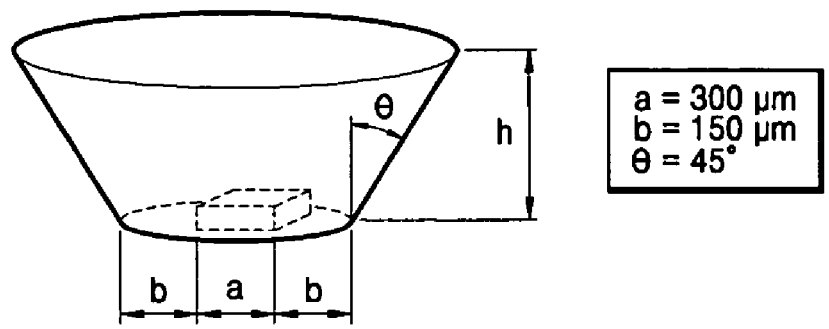
FIG. 7 is a view illustrating the sizes of the reflector cup and the LED chip used for the simulation of FIG. 6.

FIG. 6 is a table showing the result of a ray tracing simulation. FIG. 7 is a view illustrating the sizes of the reflector cup 40 and the LED chip 14 used for the simulation of FIG. 6. Here, a phosphor light source (not shown) having a wavelength of 550 nm is a cylinder type source having a thickness of 100 μm that is regularly distributed. Referring to FIGS. 6 and 7, the refractive index $n_{epoxy}$ of the seal epoxy is 1.6, the refractive index $n_{phosphor}$ of the phosphors 22 is 1.82, the reflectance $R_{Ag\ reflector}$ of the surface of the reflector cup 40 is 95%, the reflectance $R_{LED\ chip}$ of the LED chip 14 is 50%, the thickness of the LED chip 14 is 100 μm, and the size of the LED chip 14 is 300 μm×300 μm. The table of FIG. 6 illustrates light extraction efficiency according to the change in the length b from the LED chip 14 to the angled surface, the change in the height h of the reflector cup 40, and the angle θ of the angled surface.

Figure 8:
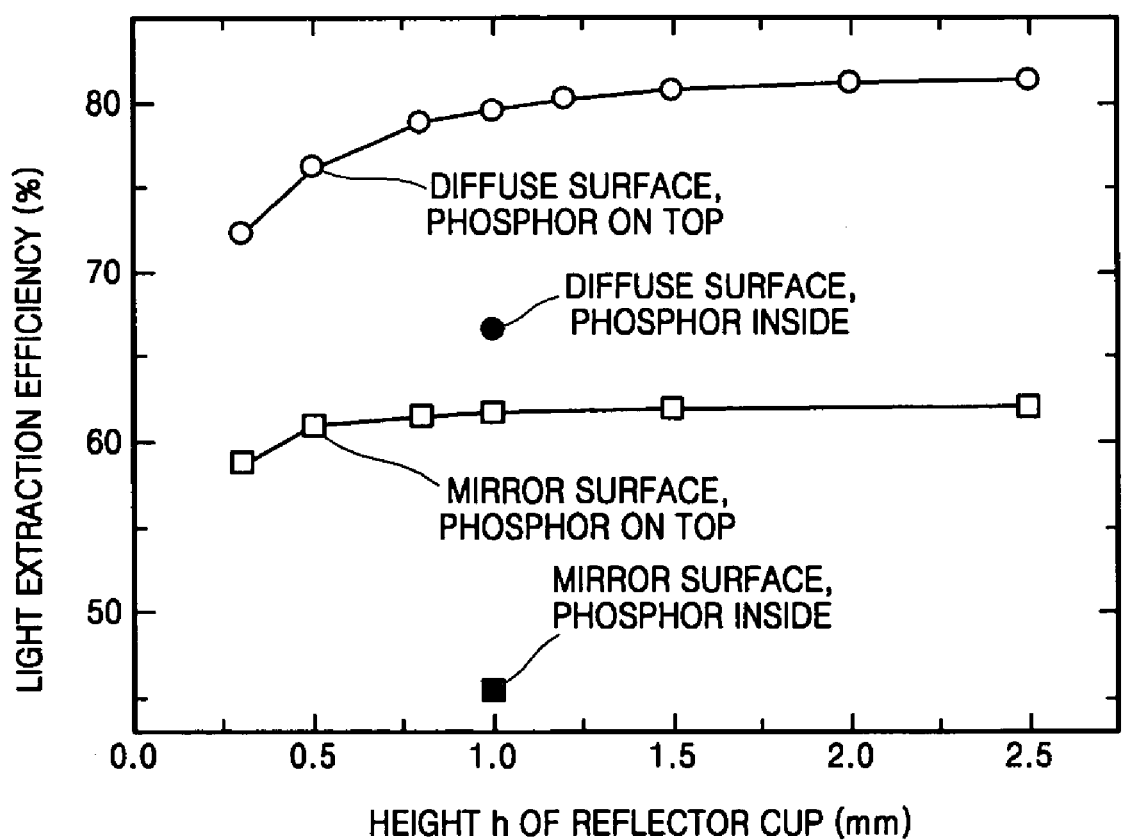
FIG. 8 is a graph showing the light extraction efficiency according to the height of the reflector cup.

FIG. 8 is a graph showing the light extraction efficiency according to the height of the reflector cup 40. Referring to FIGS. 6 and 8, when "h" is 1 mm, "θ" is 45°, and "b" is 150 μm, it is noted that the light extraction efficiency in the instance in which the phosphor is located at the top portion of the reflector cup 40 is higher than that of the instance in which the phosphor is located inside the reflector cup 40. Also, the light extraction efficiency of the reflector cup 40 having the diffuse surface is higher than that of the reflector cup having the specular mirror surface. This improvement in the light extraction efficiency results from the decrease in the probability of the re-absorption of light by the LED chip 14.

Figures 9, 10:
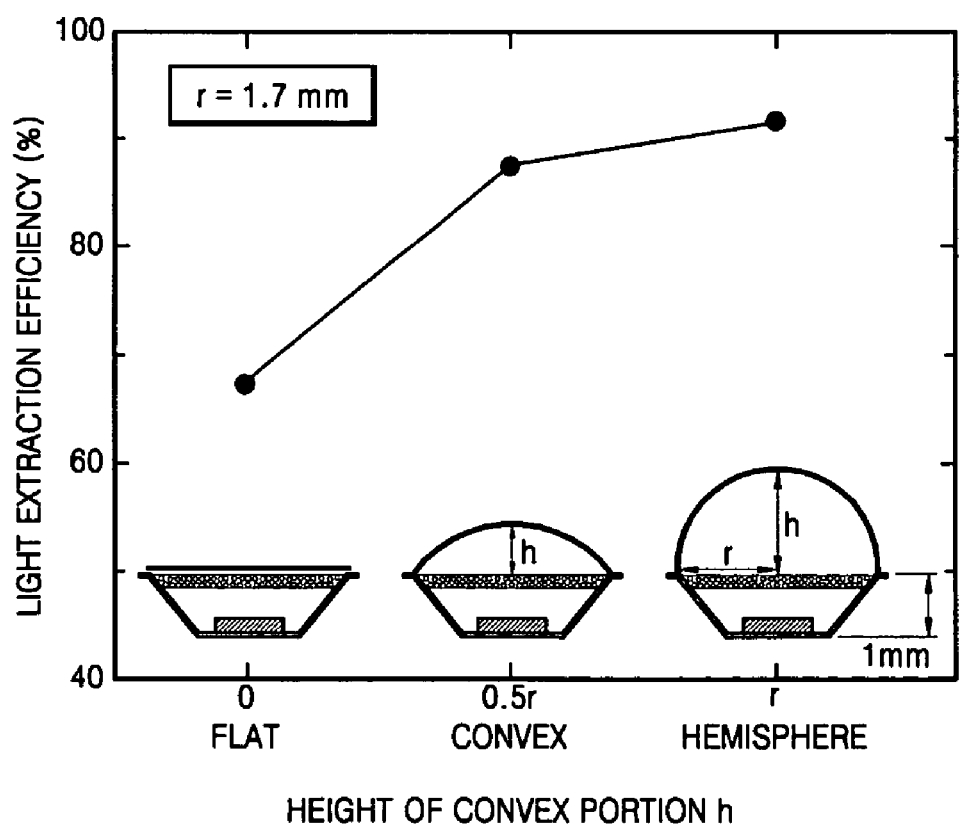
FIG. 9 is a table showing the light conversion efficiency according to the types of the reflection surface and the positions of the phosphor of the reflector cup.
FIG. 10 is a graph showing the change of the light extraction efficiency according to a convex portion which is formed on the reflector cup with the diffuse surface.

FIG. 9 is a table showing the light conversion efficiency according to the types of the reflection surface and the positions of the phosphor at the reflector cup. The light conversion efficiency is a result of calculating the amount of a decrease in the light amount from the LED chip 14 as the light conversion amount in the phosphor.

Referring to 9, when a blue phosphor is excited by an UV LED, the light conversion efficiencies of the instance in which the reflective surface is the specular mirror surface and the phosphor forms the top layer in the reflector cup 40 and the instance in which the reflective surface is the diffuse surface and the phosphor forms the top layer in the reflector cup 40 are respectively 13.1% and 27% higher than that of the instance in which the reflective surface is a specular mirror surface and the phosphor is located inside the reflector cup 40. In the instance in which a blue LED excites the yellow phosphor, when the reflective surface is the diffuse surface and the phosphor forms the top layer in the reflector cup 40, the light conversion efficiency is improved.

FIG. 10 is a graph showing the change of the light extraction efficiency according to a convex portion which is formed on the reflector cup 40 with the diffuse surface. Referring to FIG. 10, the result of the ray tracing simulation shows that the light extraction efficiency increases when the surface of the reflector cup 40 is convex rather than flat.

As described above, according to the LED device according to the present invention, the light extraction efficiency can be readily improved by processing the reflective surface of the reflector cup so as to be rough. Also, the light extraction efficiency can be improved by arranging the phosphor at the top portion of the reflector cup. Thus, since the overall light conversion efficiency of the LED device is improved, the amount of output light is increased.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An LED device having a diffuse reflective surface, the LED device comprising:
    an LED chip which emits light:
    a reflector cup having the LED chip arranged at a bottom surface thereof and having an angled inner surface, wherein the bottom surface and the angled inner surface surround the LED chip and diffusely reflect light from substantially all of the bottom surface and the angled inner surface; and
    a light conversion material provided in the reflector cup for converting the light emitted by the LED chip into visible light, wherein the light conversion material is a phosphor that is excited by the light emitted from the LED chip to emit visible light, and wherein the phosphor forms a phosphor layer in an upper portion of the reflector cup to be separated from the LED chip, and wherein the phosphor layer is separated from the LED chip by a vertical distance equal to or greater than a maximum length of the LED chip.

2. The LED device as claimed in claim 1, wherein the angled inner surface and the bottom surface are processed to be rough.

3. The LED device as claimed in claim 2, wherein the amount of light reflected at the angled inner surface and the bottom surface decreases as a reflection angle with respect to a perpendicular direction to the angled inner surface and the bottom surface increases regardless of an incident angle of the light to the angled inner surface and the bottom surface.

4. The LED device as claimed in claim 1, wherein the phosphor is a plurality of phosphors that form a plurality of visible color rays, and the phosphors are mixed with one another.

5. The LED device as claimed in claim 1, wherein the phosphor is a plurality of phosphors that form a plurality of visible color rays, and the phosphors are stacked in multiple layers.

6. The LED device as claimed in claim 1, wherein a convex portion is formed on an upper surface of the phosphor layer.

7. The LED device as claimed in claim 6, wherein the convex portion has a hemispheric shape.

8. The LED device as claimed in claim 1, wherein the LED chip is formed of III-V group nitride-based semiconductor compounds.

* * * * *